US 9,506,994 B2

(12) United States Patent
Mulholland et al.

(10) Patent No.: US 9,506,994 B2
(45) Date of Patent: Nov. 29, 2016

(54) INDUCTIVELY INTERROGATED PASSIVE SENSOR APPARATUS

(75) Inventors: John J. Mulholland, Dunfermline (GB); Corey Jaskolski, Severance, CO (US); Frank Borke, Lafayette, CO (US); Gabriel Silva, Kingwood, TX (US); Christopher D. Bartlett, Spring, TX (US)

(73) Assignee: FMC Technologies, Inc., Houston, TX (US)

( * ) Notice: Subject to any disclaimer, the term of this patent is extended or adjusted under 35 U.S.C. 154(b) by 545 days.

(21) Appl. No.: 13/639,592

(22) PCT Filed: Apr. 6, 2010

(86) PCT No.: PCT/US2010/001045
§ 371 (c)(1),
(2), (4) Date: Feb. 25, 2013

(87) PCT Pub. No.: WO2011/126466
PCT Pub. Date: Oct. 13, 2011

(65) Prior Publication Data
US 2013/0147470 A1 Jun. 13, 2013

(51) Int. Cl.
*G01R 33/00* (2006.01)
*G01D 5/20* (2006.01)
*G01R 33/02* (2006.01)

(52) U.S. Cl.
CPC ........... *G01R 33/0005* (2013.01); *G01D 5/204* (2013.01); *G01R 33/0017* (2013.01); *G01R 33/02* (2013.01)

(58) Field of Classification Search
CPC .......... G01D 5/06; G01D 5/12–5/242; G01R 33/0005; G01R 33/0017; G01R 33/02; H04B 5/00; H04B 5/0031; H04B 5/0075; H04B 5/0093; H04B 5/0037; H04B 5/0043; G06K 19/0716; G06K 19/0717; G06K 19/0723
USPC .......... 324/225, 234, 200; 455/41.1
See application file for complete search history.

(56) References Cited

U.S. PATENT DOCUMENTS

| 3,824,848 | A | | 7/1974 | Parkinson |
| 3,946,256 | A | * | 3/1976 | Day et al. .................. 310/313 B |
| 5,594,705 | A | * | 1/1997 | Connor et al. ................... 367/13 |
| 5,790,016 | A | | 8/1998 | Konchin et al. |
| 5,793,200 | A | * | 8/1998 | Berrill ..................... G01D 5/145 324/207.12 |
| 6,025,725 | A | | 2/2000 | Gershenfeld et al. |

(Continued)

FOREIGN PATENT DOCUMENTS

GB 2295293 A * 5/1996 .......... G07C 9/00182

*Primary Examiner* — Minh N Tang
*Assistant Examiner* — David Frederiksen
(74) *Attorney, Agent, or Firm* — Henry C. Query, Jr.

(57) ABSTRACT

A sensor apparatus comprises a first magnetic transducer which in use is positioned on a first side of a barrier and a second magnetic transducer which in use is positioned on a second side of the barrier opposite the first side. The second transducer comprises a magnetic or electrical property which is dependent upon a sensible condition on the second side of the barrier, such as the pressure or temperature on the second side of the barrier. In operation, the first transducer generates a first magnetic field which induces the second transducer to generate a second magnetic field that is dependent upon the magnetic or electrical property of the second transducer. The first transducer detects the second magnetic field and generates a signal which is representative of the sensible condition on the second side of the barrier.

88 Claims, 6 Drawing Sheets

(56) References Cited

U.S. PATENT DOCUMENTS

| | | |
|---|---|---|
| 6,124,787 A | 9/2000 | Isakov et al. |
| 6,335,690 B1 | 1/2002 | Konchin et al. |
| 6,535,133 B2* | 3/2003 | Gohara ................. 340/584 |
| 6,566,636 B1 | 5/2003 | Bentley et al. |
| 6,625,084 B1* | 9/2003 | Payton ................. 367/134 |
| 6,677,859 B1 | 1/2004 | Bensen |
| 7,159,456 B2 | 1/2007 | Pechtold et al. |
| 7,159,774 B2 | 1/2007 | Woodard et al. |
| 7,394,244 B2* | 7/2008 | Schley ................. G01D 5/252 324/207.2 |
| 7,477,050 B2 | 1/2009 | Gambino et al. |
| 7,589,525 B2 | 9/2009 | Woodard et al. |
| 8,588,681 B2* | 11/2013 | Nakagawa ................. 455/41.1 |
| 2004/0150393 A1* | 8/2004 | Lequesne ............ G01D 5/145 324/207.21 |
| 2006/0212193 A1 | 9/2006 | Breed |
| 2008/0070499 A1 | 3/2008 | Wilhelm et al. |
| 2008/0184795 A1 | 8/2008 | Woodard |
| 2008/0197835 A1 | 8/2008 | Reime |
| 2008/0306359 A1* | 12/2008 | Zdeblick ............ A61B 5/0028 600/302 |
| 2009/0008994 A1* | 1/2009 | Tonn et al. ................. 307/17 |
| 2009/0105581 A1* | 4/2009 | Widenhorn ......... A61B 5/6814 600/411 |
| 2009/0143673 A1 | 6/2009 | Drost et al. |
| 2010/0174495 A1 | 7/2010 | Pereira et al. |

* cited by examiner

INDUCTIVELY INTERROGATED PASSIVE SENSOR APPARATUS

BACKGROUND OF THE INVENTION

The present invention relates to a sensor apparatus for sensing a condition inside a barrier, such as a ship hull or an oil pipeline. In particular, the invention relates to a sensor apparatus which communicates inductively with a passive sensor located inside the barrier. The sensor apparatus comprises no active electrical components inside the barrier and does not require that external power or data lines penetrate the barrier in order to power or communicate with the sensor. In addition, the present invention includes a number of methods for nulling out the eddy currents which are generated in a conductive barrier during operation of the sensor apparatus to thereby enable the sensor apparatus to work effectively through metal or other conductive barriers.

Sensors have been used for decades to sense environmental conditions inside structures. In the hydrocarbon production industry, for example, sensors are commonly used to sense the pressure and temperature of the production fluid flowing through pipelines. Many prior art sensors typically require both a power source and a data link in order to communicate with an associated data processing apparatus. Even if the sensor includes its own power source, such as a battery, a data line is still required to provide the necessary data link to the sensor. Therefore, the structure in which the sensor is located must normally be breached in order to accommodate the data line. However, breaching the structure for this purpose is undesirable, especially in structures containing high pressure fluids, such as oil pipelines.

Although inductive power and data communications systems exist which can wirelessly transmit both power and data through many materials, including those typically used to make oil pipelines, these systems normally require active electrical components both inside and outside of the structure. However, the use of active electrical components in certain environments is problematic. For example, with the exception of certain silicon carbide electronics, which are usable at temperatures of up to around 250° C. but are not available for most applications, even the highest rated Mil-Spec electrical components typically begin to fail at around 125° C. In this regard, even the high temperature solders which are used in such components usually begin to melt at about 220° C. Consequently, in certain structures, such as subsea oil pipelines, where temperatures can reach 180° C. to 320° C. or higher, the use of active electrical components is not practical.

Furthermore, although inductively interrogated passive sensor systems exist in the prior art, to the inventors' knowledge these systems do not work when the passive sensor is positioned entirely within or against a conductive barrier.

For example, U.S. Pat. No. 7,159,774 describes an inductively interrogated passive sensor system in which a passive magnetic field response sensor is excited by a radio frequency (RF) signal and in response thereto generates a magnetic field which is indicative of a condition to be sensed. The passive magnetic field response sensor comprises either an inductor-capacitor (L-C) circuit or an inductor-resistor-capacitor (L-R-C) circuit, and the RF signal is generated by an antenna which is positioned on the opposite side of a barrier from the sensor. When excited by the RF signal, the L-C or L-R-C circuit generates a magnetic field which is dependent on the values of the inductance, capacitance and/or resistance of its components, which in turn are dependent on the condition or conditions to which the components are exposed, and the inductor transmits this magnetic field back to the antenna. However, this system will not work when the antenna and the entire passive sensor are positioned on opposite sides of a conductive barrier. Instead, the inductor must be positioned on the same side of the barrier as the antenna and connected to the remainder of the L-C or L-R-C circuit through a hole in the barrier. In addition, even when positioned outside the conductive barrier, the system will not work when the inductor is positioned against the barrier due to the large eddy currents which the magnetic field generates in the barrier.

SUMMARY OF THE INVENTION

In accordance with the present invention, these and other limitations in the prior art are addressed by providing a sensor apparatus which comprises a first magnetic transducer which in use is positioned on a first side of a barrier and a second magnetic transducer which in use is positioned on a second side of the barrier opposite the first side, the second transducer comprising a magnetic or electrical property which is dependent upon a sensible condition on the second side of the barrier. In operation of the sensor apparatus, the first transducer generates a first magnetic field which induces the second transducer to generate a second magnetic field which is dependent upon the magnetic or electrical property of the second transducer. In addition, the first transducer detects the second magnetic field and in response thereto generates a signal which is representative of the sensible condition on the second side of the barrier.

In accordance with one embodiment of the invention, the first transducer comprises at least one transmitter coil for generating the first magnetic field and at least one receiver coil for detecting the second magnetic field.

In accordance with a second embodiment of the invention, the first transducer comprises two transmitter coils for generating the first magnetic field. Furthermore, each of the transmitter and the receiver coils may comprise a toroid.

In accordance with another embodiment of the invention, the transmitter coils are positioned coaxially and in parallel planes and the receiver coil is positioned parallel to the transmitter coils.

In accordance with a further embodiment of the invention, the receiver coil is positioned between the transmitter coils a distance sufficient to substantially null out the first magnetic field at the receiver coil.

In accordance with yet another embodiment of the invention, the receiver coil is positioned between the transmitter coils a distance sufficient to at least partially null out at the receiver coil a reflected magnetic field generated by eddy currents in the barrier.

In accordance with still another embodiment of the invention, the first transducer comprises at least one transmitter coil for generating the first magnetic field, a first receiver coil for detecting both the second magnetic field and a reflected magnetic field generated by eddy currents in the barrier, and a second receiver coil for detecting primarily the reflected magnetic field. In this embodiment, the first transducer may comprise two transmitter coils for generating the first magnetic field. In addition, the transmitter coils may be positioned coaxially and in parallel planes and the receiver coils may be positioned parallel to the transmitter coils. Furthermore, the first receiver coil may be positioned partially between the transmitter coils on one side of the transmitter coils, the second receiver coil may be positioned partially between the transmitter coils on the diametrically opposite side of the transmitter coils, and the sensor transducer may be positioned opposite the area of overlap between the transmitter coils and the first receiver coil. In operation of this embodiment of the invention, the first receiver coil generates a first signal, the second receiver coil generates a second signal and the sensor apparatus further comprises means for combining the first and second signals to produce a signal which is representative of the sensible condition on the second side of the barrier.

In yet another embodiment of the invention, the sensor apparatus comprises a nulling transducer for generating a third magnetic field which is sufficient to at least partially null out at the receiver coil a reflected magnetic field generated by eddy currents in the barrier. The nulling transducer may comprise, for example, a coil which is wound around a toroidal or a generally C-shaped core which is positioned around a segment of the receiver coil.

In accordance with another embodiment of the invention, at least one of the transmitter coil and the receiver coil may further comprise a disc-shaped core which is positioned concentrically therein and is made of a high permeability material.

In accordance with yet another embodiment of the invention, the second transducer comprises a magnetically permeable member having a magnetic property which is dependent upon the sensible condition on the second side of the barrier. In this embodiment, the member may comprise a relative magnetic permeability of greater than about 1000.

In accordance with still another embodiment of the invention, the second transducer comprises a passive sensor device having an electrical property which is dependent upon the sensible condition on the second side of the barrier. The second transducer may also comprise a coil of conductive wire which is coupled to the sensor device. For example, the sensor device may be connected between the ends of the wire. The sensor transducer may further comprise a magnetically permeable core around which the wire is wound. The core may comprise a relative magnetic permeability of greater than about 1000.

Thus, the sensor apparatus of the present invention provides a simple but effective means for sensing conditions in a part of a structure or barrier which is difficult or impractical to access, such as in an oil pipeline. This is accomplished by installing the active electrical components of the sensor apparatus, i.e., the first transducer and any associated signal processing equipment, outside the barrier and only installing the second transducer and the sensor inside the barrier. Moreover, since the second transducer and the sensor are non-powered devices and the second transducer communicates with the first transducer through magnetic induction, the sensor apparatus does not require the barrier to be penetrated with external power or data lines.

Another advantage of the present invention is that, since the second transducer and the sensor are non-powered devices and the active electrical components are located outside the barrier, the sensor apparatus of the present invention is particularly suitable for use in high pressure, high temperature and explosive environments.

Furthermore, since the sensor apparatus of the present invention effectively nulls out the eddy current-generated magnetic field at the receiver coil, the sensor apparatus is particularly effective for use in sensing conditions inside a conductive barrier. Moreover, this feature allows the sensor apparatus to work even when the transmitter coils are positioned near or against the conductive barrier, such as when the first transducer is mounted directly on the outer surface of the conductive barrier.

These and other objects and advantages of the present invention will be made apparent from the following detailed description, with reference to the accompanying drawings. In the drawings, the same reference numbers may be used to denote similar components in the various embodiments.

DETAILED DESCRIPTION OF THE INVENTION

Figure 1:
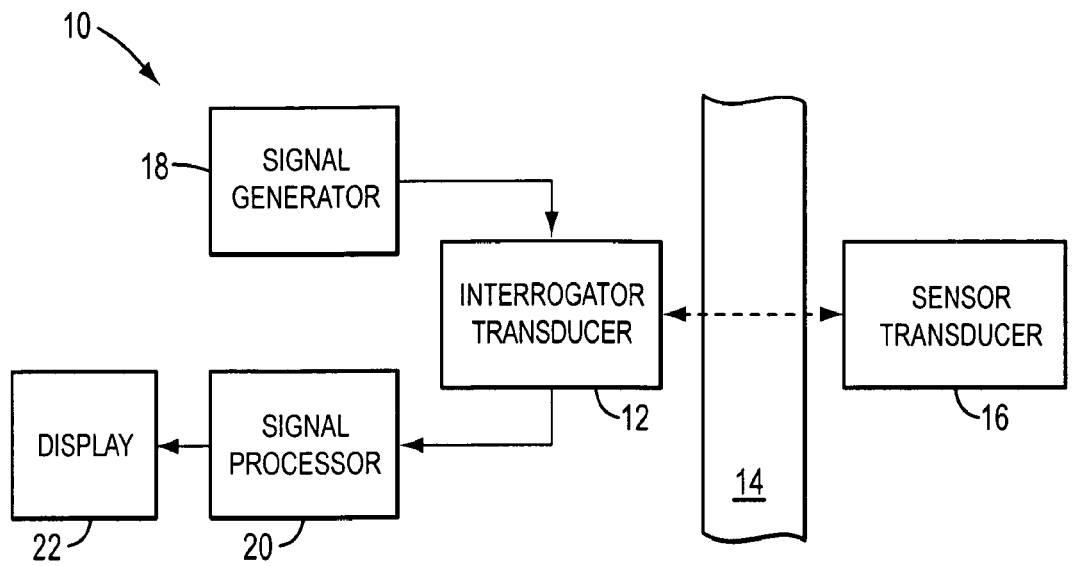
FIG. 1 is a block diagram of one embodiment of the sensor apparatus of the present invention.

A block diagram of an illustrative embodiment of the sensor apparatus of the present invention is shown in FIG. 1. The sensor apparatus of this embodiment, which is indicated generally by reference number 10, comprises a magnetic interrogator transducer 12 which in use is positioned on one side of a barrier 14, and a magnetic sensor transducer 16 which in use is positioned on the opposite side of the barrier and is magnetically coupled to the interrogator transducer. In this embodiment of the invention, a preferably very low frequency (VLF) AC signal from a signal generator 18 is applied to the interrogator transducer 12, which in response thereto generates a time-varying magnetic field that propagates through the barrier 14 and is impressed on the sensor transducer 16.

As will be described more fully below, the magnetic field generated by the interrogator transducer 12 induces the sensor transducer 16 to generate its own time-varying magnetic field. This magnetic field is dependent upon the magnetic or electrical properties of the sensor transducer 16, which in turn are dependent upon the sensible condition to which the sensor transducer is exposed on its side of the barrier 14. In the context of the present invention, a sensible condition can be any condition which is capable of being sensed, such as pressure, temperature, proximity to other objects, orientation and fluid level.

Thus, the magnetic field generated by the sensor transducer 16 contains information representative of the condition which is sensed by the sensor transducer. This magnetic field is transmitted through the barrier 14 and is detected by the interrogator transducer 12. The resulting data signal produced by the interrogator transducer 12 is fed to a signal processor 20, which extracts the information relating to the sensible condition and transmits this information to, for example, a display unit 22.

The sensor apparatus 10 may comprise any suitable signal generator 18 and signal processor 20. For example, a working embodiment of the invention was constructed using an Agilent 3220A function generator as the signal generator 18. The signal from this signal generator was amplified by a Crown analog amplifier prior to being transmitted to the interrogator 12. The return signal from the interrogator transducer 12 was fed to a National Instruments PXI signal processor 20, which comprised a NI PXI-1050 chassis, a NI PXI-8187 controller and a NI PXI-6251 analog input. Other signal generators 18 and signal processors 20 which are suitable for use in the present invention will be readily apparent to persons of ordinary skill in the art.

In one embodiment of the invention, the interrogator transducer 12 is operated to generate a magnetic field continuously over a period of time. This continuous magnetic field will in turn induce the sensor transducer 16 to generate a continuous magnetic field during this same period of time. Thus, the interrogator transducer 12 will be transmitting its magnetic field at the same time it is detecting the magnetic field generated by the sensor transducer 16. By operating in this manner, the sensor transducer 16 is able to provide near real-time information regarding the sensible condition to which it is exposed.

Figure 2:
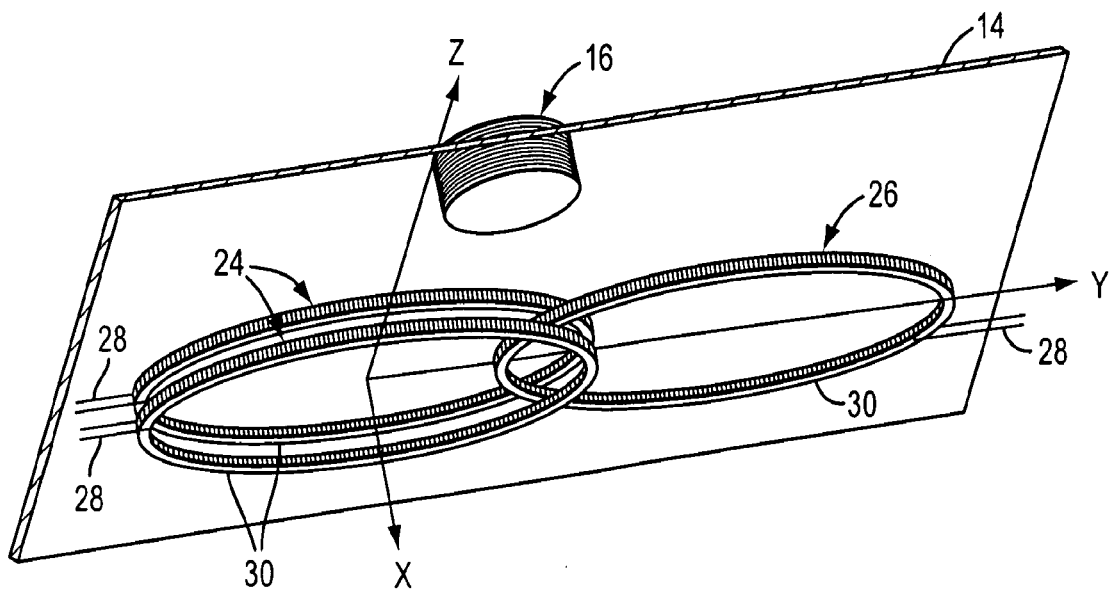
FIG. 2 is a perspective view of the interrogator and sensor transducer components in accordance with one embodiment of the present invention.

Referring to FIG. 2, the interrogator transducer 12 in accordance with one embodiment of the invention includes two transmitter coils 24 which are connected to the signal generator 18 and a receiver coil 26 which is connected to the signal processor 20. In this embodiment of the invention, each of the transmitter and receiver coils 24, 26 comprises a conductive wire 28 which is wrapped around a doughnut-shaped core 30. The two transmitter coils 24 are positioned coaxially and in parallel planes, and the receiver coil 26 is positioned parallel to and preferably partially between the transmitter coils. As will be explained in more detail below, the distance which the receiver coil 26 is inserted between the transmitter coils 24 is selected so that the magnetic field generated by the transmitter coils is nulled out at the receiver coil.

Figure 2A:
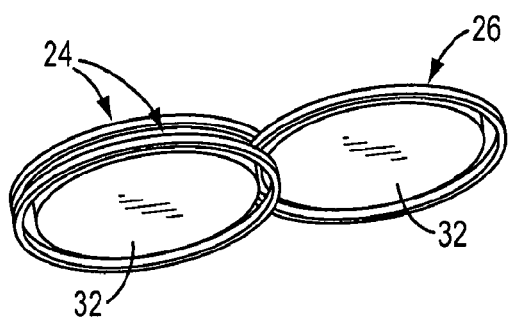
FIG. 2A is a perspective view of the interrogator transducer components in accordance with another embodiment of the present invention.

In an alternative embodiment of the invention shown in FIG. 2A, each of the transmitter coils 24 and/or the receiver coil 26 also comprises a high permeability disc-shaped core 32 which is positioned within the doughnut-shaped core 30, Such an arrangement increases the magnetic coupling between the interrogator transducer 12 and the sensor transducer 16 and therefore increases the strength of the transmitted and received signals.

In an exemplary embodiment of the invention, each transmitter coil 24 is a toroid comprising 36 turns of 22 AWG magnet wire (i.e., varnish coated solid wire) around a core 30 having a thickness of 0.1875 inch, an outer diameter of 7.25 inches and an inner diameter of 4.60 inches. The two transmitter coils 24 are electrically connected in parallel and are positioned so that for a given input their respective magnetic fields are oriented in the same direction, for example in the manner of a Helmholtz coil. Also, the receiver coil 26 is a toroid comprising 600 turns of 34 AWG magnet wire around a core 30 having a thickness of 0.1875 inch, an outer diameter of 7.25 inches and an inner diameter of 4.60 inches. If employed in this exemplary embodiment of the invention, each high permeability disc-shaped core 32 would comprise a thickness of about 0.17 inches and a diameter of about 4.5 inches and would be retained in position within the cores 30 by a suitable non-conducting structure.

In use of the sensor apparatus 10, the interrogator transducer 12 is positioned on one side of the barrier 14 and the sensor transducer 16 is positioned on the opposite side of the barrier (which in FIG. 2 is illustrated as being transparent for purposes of clarity). The barrier 14 may comprise any conductive or nonconductive material or substance which is disposed between the interrogator and sensor transducers 12, 16. Examples of conductive materials or substances include metal, saltwater and even animal tissue.

An example of a metal barrier is a pressure-containing metal pipe which is used in the hydrocarbon production industry to convey production fluid from a well to a production or storage facility. In this example, the interrogator transducer 12 would be located on the outside of the pipe and the sensor transducer 16 would be positioned on the inside of the pipe 14 to measure a condition of the production fluid, such as its pressure or temperature. An example of a saltwater barrier is seawater. In this example, the sensor transducer 16 would be mounted on a subsea component, such as a pipeline, to measure a condition of the component and the interrogator transducer 12 would be positioned in proximity to, but not necessarily in contact with, the sensor transducer. An example of an animal tissue barrier is human tissue. In this example, the interrogator transducer 12 would be located outside the body and the sensor transducer 16 would be placed in the body, for example under the skin, to measure a condition of the body, such as arterial pressure or intracranial pressure.

Examples of nonconductive materials or substances which may constitute barriers for purposes of the present invention include plastics, elastomers and various insulation materials. An example of a plastic barrier is a plastic waterproof housing for a sensor transducer 16. In this example, the sensor transducer 16 would be positioned in a plastic housing which is mounted to, e.g., a subsea component and the interrogator transducer 12 would be positioned against or in proximity to the housing. An example of an insulation barrier is a layer of epoxy or polymer resin which is applied to, e.g., a subsea component. In this example, the sensor transducer 16 would be mounted on the subsea component under the insulation layer and the interrogator transducer 12 would be located on the outside of the insulation layer.

The barrier 14 may also comprise a combination of two or more materials or substances For example, the barrier 14 may comprise a non-conductive housing which is submerged in saltwater. In this example, the sensor transducer 16 would be positioned in the housing and the interrogator transducer 12 would be positioned in the seawater in proximity to, but not necessarily in contact with, the housing. In any of the above examples, the interrogator and sensor transducers 12, 16 may be positioned either in contact with or spaced-apart from the barrier 14.

In accordance with the present invention, the sensor transducer 16 is a non-powered device. In the context of the present invention, a non-powered device is a device to which no external power is supplied (except for the magnetic flux from the interrogator transducer, which will cause some current to flow through the device). In addition, the sensor transducer 16 communicates with the interrogator transducer 12 through magnetic induction. Therefore, the sensor apparatus 10 does not require the sensor transducer 16 to be connected to external power or data lines. Consequently, no need exists to penetrate the barrier 14 in order to accommodate such lines.

Figure 3A:
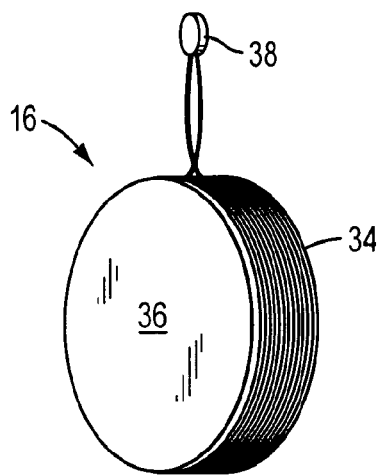
FIG. 3A is a perspective view of one embodiment of the sensor transducer component of the present invention.

Referring to FIG. 3A, one embodiment of the sensor transducer 16 of the present invention comprises a conductive wire 34 which is wound concentrically around a disc-shaped core 36 and is connected to a passive sensor device 38. In the context of the present invention, a passive sensor device is a sensor device which does not require any power, except for the power generated by the induced magnetic flux, in order to alter the return magnetic signal in response to changes in the sensible conditions. The core 36 is made of a material which ideally comprises a relative magnetic permeability of greater than about 1000. In an exemplary embodiment of the invention, the wire 34 comprises 19 turns of 22 AWG magnet wire and the core 36 is made of 3C90 Ferrite and has a diameter of 2.20 inches and a thickness of 0.725 inch. In this embodiment, the sensor transducer 16 is ideally positioned so that the core 36 is parallel to the transmitter and receiver coils 24, 26.

Figure 3B:
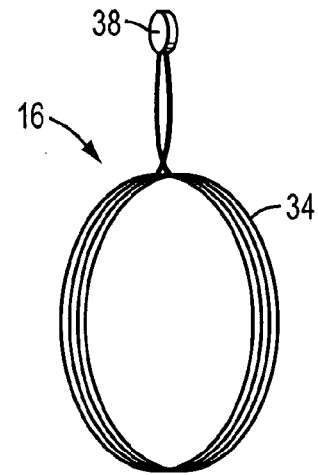
FIG. 3B is a perspective view of a second embodiment of the sensor transducer component of the present invention.

In an alternative embodiment of the sensor transducer 16 which is shown in FIG. 3B, the high magnetic permeability core 36 is omitted and the sensor transducer merely comprises the wire 34 and the passive sensor device 38. In this embodiment, the wire 34 may comprise 120 turns of 34 AWG magnet wire wound to a diameter of 3.0 inches. In the embodiments of the sensor transducer 16 shown in FIGS. 3A and 3B, the passive sensor device 38 is electrically connected between the ends of the wire 34. However, the sensor device 38 may alternatively be magnetically coupled to the wire 34 or to the core 36. The principles of the present invention hold for either case.

The sensor device 38 may comprise any passive sensor whose electrical property, such as resistance, inductance or capacitance, changes in response to changes in the sensible condition to which the sensor is subjected. Examples of passive sensors include thermistors, which change resistance in response to changes in temperature; strain gauges, which change resistance in response to changes in strain; and capacitive and crystal-based pressure sensors, which change capacitance in response to changes in pressure. In addition, many active flow meters, fluid level sensors, position sensors and orientation sensors change resistance or capacitance with changes in their corresponding measured quantities. As such, these commercially available off-the-shelf devices may be used in conjunction with the present invention without their corresponding power and data links.

In operation of the sensor apparatus 10, the transmitter coils 24 are driven with a preferably VLF AC signal having a particular frequency or frequencies. In response to this signal, the transmitter coils 24 generate a magnetic flux at the same frequency or frequencies as the AC signal. Some of this flux passes through the barrier 14 and also through the core 36 of the sensor transducer 16. The flux passing through the core 36 induces a small current to flow through the wire 34. The current flowing through the wire 34 in turn generates a magnetic field that, passes back through the barrier 14 and is detected by the receiver coil 26. In the case of the sensor transducer 16 shown in FIG. 3B, which does not include a core 36, the magnetic flux generated by the transmitter coils 24 passes through the region defined by the wire 34 and induces a small current to flow through the wire which in turn generates a magnetic field that passes back through the barrier and is detected by the receiver coil 26.

As will be appreciated by persons of ordinary skill in the art, the amplitude, phase, resonant frequency and bandwidth of the current flowing through the wire 34 are dependent upon the electrical properties of the passive sensor device 38 connected to the wire. Thus, a change in the resistance of the sensor device 38 will result in changes in the amplitude, phase and bandwidth of the current, while a change in the capacitance or inductance of the sensor will result in changes in the amplitude, phase, bandwidth and resonant frequency of the current. In addition, these changes will induce corresponding changes in the amplitude, phase, resonant frequency and bandwidth of the magnetic field generated by the current. Thus, the changes in the amplitude, phase, resonant frequency and bandwidth of the magnetic field generated by the current flowing through the wire 34 are related to the change in the electrical property of the sensor device 38, which in turn is related to the change in the sensible condition to which the sensor is subjected.

As mentioned above, the magnetic field generated by the current flowing though the wire 34 is detected by the receiver coil 26. In response to this magnetic field, the receiver coil 26 generates a data signal in the form of an AC current which has the same amplitude, phase, resonant frequency and bandwidth as the magnetic field. The data signal is transmitted to the signal processor 20, which amplifies the signal and, using an appropriate known measuring circuit, measures the amplitude, phase, resonant frequency or bandwidth of the signal. For example, the signal processor 20 may comprise a digital signal processor integrated circuit running a known phase detection algorithm for measuring the phase of the signal.

The measured values of the amplitude, phase, resonant frequency or bandwidth of the data signal are correlated with the conventional measurement values of the sensible condition using a suitable calibration procedure. If the passive sensor device 38 is a thermistor, for example, the measured values of amplitude, phase, resonant frequency or bandwidth of the data signal are correlated with the corresponding temperatures of the environment in which the sensor is located. A number of known calibration procedures may be used for this purpose.

Figure 3C:
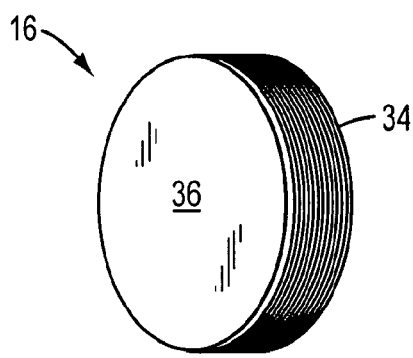
FIG. 3C is a perspective view of a third embodiment of the sensor transducer component of the present invention.

Another embodiment of the sensor transducer 16 is shown in FIG. 3C. In this embodiment of the invention, the sensor device 38 is omitted and the sensor transducer 16 merely comprises a core 36 wound with a wire 34, the ends of which are joined together. As is readily understood by those of ordinary skill in the art, the magnetic permeability of the core 36 and the electrical resistivity of the wire 34 will change with changes in certain sensible conditions to which the sensor transducer 16 is exposed. For example, both of these parameters will change in response to changes in temperature. In addition, the magnetic permeability of the core 36 will change in response to changes in hydrostatic pressure. The changes in permeability and resistivity will in turn alter the amplitude and phase of the magnetic field produced by the sensor transducer 16 in response to the time-varying magnetic field generated by the interrogator transducer 12, and these changes in amplitude or phase can be detected by the interrogator transducer to provide an indication of the sensible conditions of the environment in which the sensor transducer 16 is located.

Figure 3D:
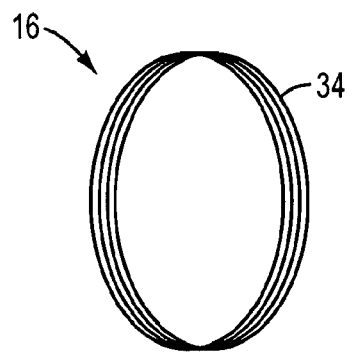
FIG. 3D is a perspective view of a fourth embodiment of the sensor transducer component of the present invention.

A further embodiment of the sensor transducer 16 is shown in FIG. 3D. In this embodiment the sensor transducer 16 simply comprises a coil of wire 34 whose ends are joined together. As in the previously embodiment, changes in, for example, the temperature to which the sensor transducer 16 is exposed will change the resistivity of the wire 34 and consequently alter the magnetic field produced by the sensor transducer in response to the magnetic field generated by the interrogator transducer 12. These changes in the magnetic field can then be detected by the interrogator transducer 12 to provide an indication of the sensible conditions of the environment in which the sensor transducer 16 is located.

As mentioned above, the receiver coil 26 is ideally positioned at least partially between the transmitter coils 24. The purpose of this is to null out the magnetic field which the receiver coil 26 sees from the transmitter coils 24. Accordingly, the distance which the receiver coil 26 is positioned between the transmitter coils 24 is selected so that equal amounts of flux pass through the receiver coil in both the positive and negative directions, thereby resulting in the magnetic field generated by the transmitter coils being substantially zero at the receiver coil. This distance may be determined empirically during the design of the sensor apparatus 10 and may be maintained using any suitable housing or supporting structure in which the coils 24, 26 are disposed.

The geometric nulling technique just described is desirable to facilitate the detection by the receiver coil 26 of the magnetic field generated by the sensor transducer 16. Since the magnetic field generated by the sensor transducer 16 is small in comparison to that generated by the transmitter coils 24, the receiver coil 26 may otherwise not be able to distinguish the magnetic field generated by the sensor transducer from that generated by the transmitter coils. Of course, other techniques, including non-mechanical signal processing techniques, may be used instead to facilitate the detection by the receiver coil 26 of the magnetic field generated by the sensor transducer 16.

When the sensor apparatus 10 is used in conjunction with a barrier 14 comprising a conductive medium, such as a large body of metal, the eddy currents developed in the barrier as a result of the magnetic field generated by the transmitter coils 24 create a relatively large reflected magnetic field. As a result, the magnetic field detected by the receiver coil 26 will be an arithmetic sum of the magnetic field from the sensor transducer 16 and the reflected magnetic field from the barrier 14. As such, the effective signal to noise ratio is decreased and the ability to make high resolution sensor measurements is compromised. The amplitude of the magnetic field generated by the eddy currents increases, and the effective signal to noise ratio decreases, the closer the transmitter coils 24 are positioned to the conductive barrier. Consequently, the resulting low signal to noise ratio may reduce the effectiveness of the sensor apparatus 10 when the transmitter coils 24 are positioned near or against the conductive barrier.

In accordance with the present invention, the noise attributable to the eddy current-induced magnetic field from the conductive barrier 14 may be minimized or eliminated by, in effect, nulling out this magnetic field, thereby enabling the transmitter coils 24 to be positioned near or adjacent the conductive barrier. In the embodiment of the invention shown in FIG. 2, for example, the eddy current-induced magnetic field may be reduced by adjusting receiver/transmitter interleave distance, i.e., the distance the receiver coil 26 is inserted between the transmitter coils 24.

Figure 4:
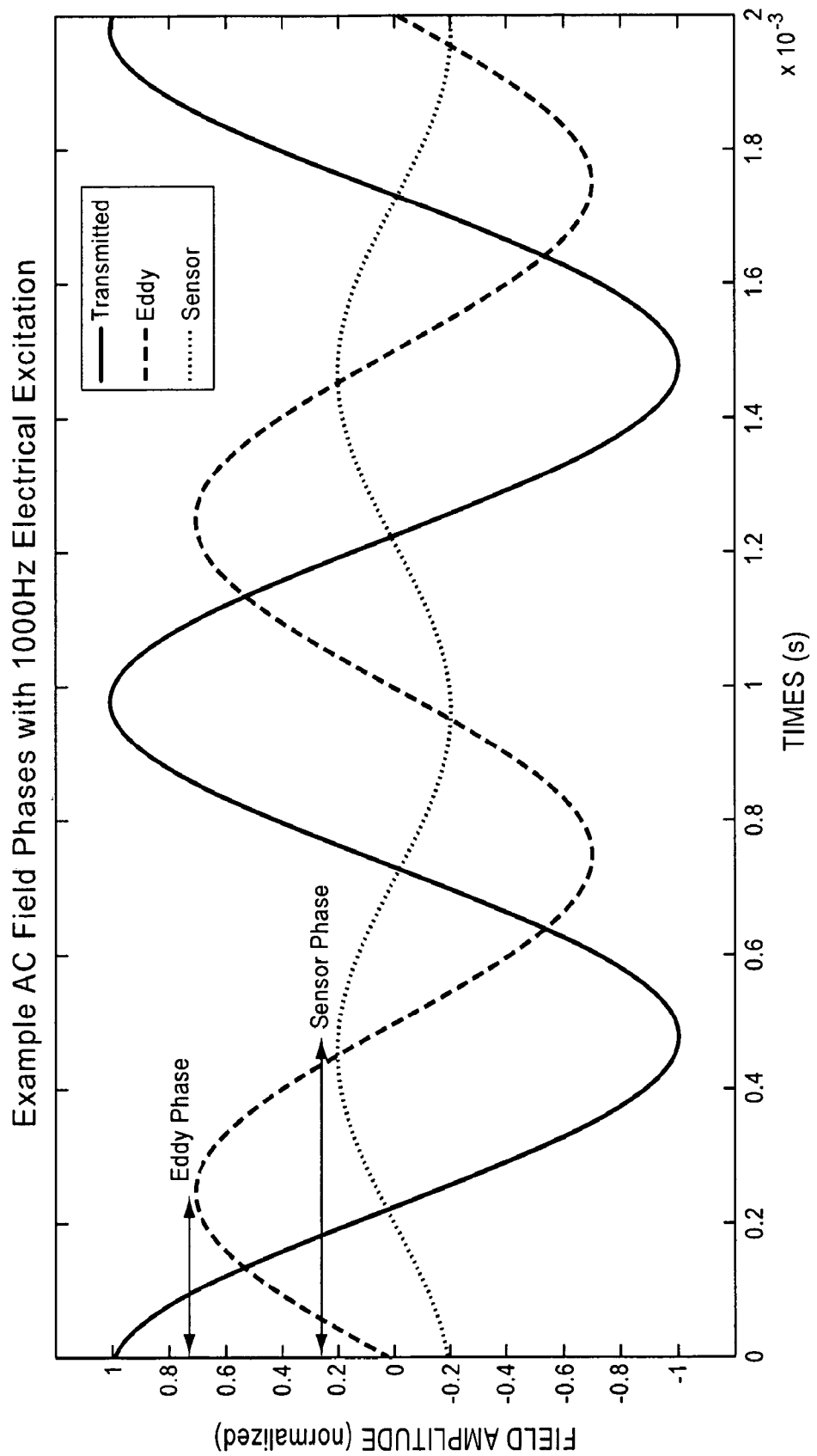
FIG. 4 is a plot of the representative magnetic fields generated by the sensor apparatus of the present invention.

The magnetic field detected by the receiver coil 26 is the arithmetic sum of primarily three fields: the field generated by the transmitter coils 24 (which may be referred to as the transmitter field), the field generated by the eddy currents in the barrier 14 (which may be referred to as the eddy current field), and the field generated by the sensor transducer 16 (which may be referred to as the sensor field). (A fourth field is produced by the eddy currents induced in the barrier 14 by the magnetic field generated by the sensor transducer 16, but this field is typically very small in comparison to the transmitter, the eddy current and the sensor fields and can therefore usually be ignored, although it may be nulled out at the receiver coil using the nulling techniques described herein if desired.) The transmitter, eddy current and sensor fields will have the same frequency as the excitation signal from the signal generator 18 but separate amplitudes and phases. The eddy current field will typically have a considerably higher amplitude than that of the sensor field, which is the field we wish to detect. The relationship between the transmitter field, the eddy current field and the sensor field is shown by way of example in FIG. 4.

As seen from the receiver coil 26, the amplitude of the transmitter field can be increased or decreased by changing the receiver/transmitter interleave distance. As described above, this mechanism is used to null out the transmitter field at the receiver coil 26 so that the sensor field can be more easily detected. However, since the eddy current field is out of phase with the transmitter and sensor fields, further adjustment of the receiver/transmitter interleave distance can allow for partial or total cancelation of the eddy current effect by summing these out-of-phase fields.

Figure 5:
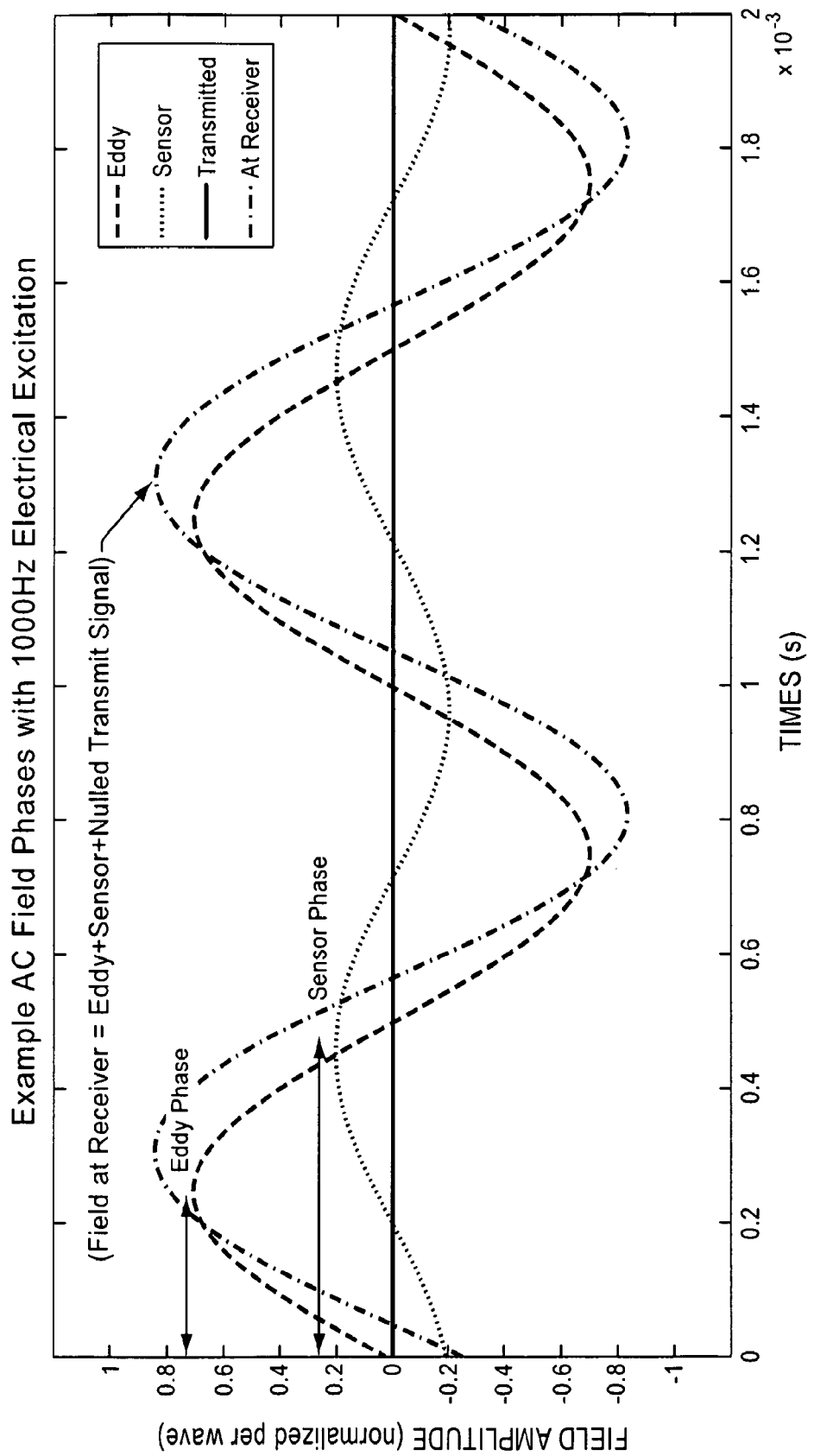
FIG. 5 is a plot similar to FIG. 4 but showing the magnetic fields after one of the nulling techniques of the present invention has been applied to the interrogator transducer.

By way of illustration, FIG. 5 shows that with a nulled transmitter field (which is achieved by adjusting the receiver/transmitter interleave distance), the field detected by the receiver coil 26 is dominated by the eddy current field. However, by further adjusting the amplitude of the transmitter field as seen by the receiver coil 26 (by further adjusting the receiver/transmitter interleave distance), the transmitter field can be made to partially or fully cancel out the out-of-phase eddy current field, which will result in the cumulative field detected by the receiver coil being more closely matched to the sensor field.

Figure 6:
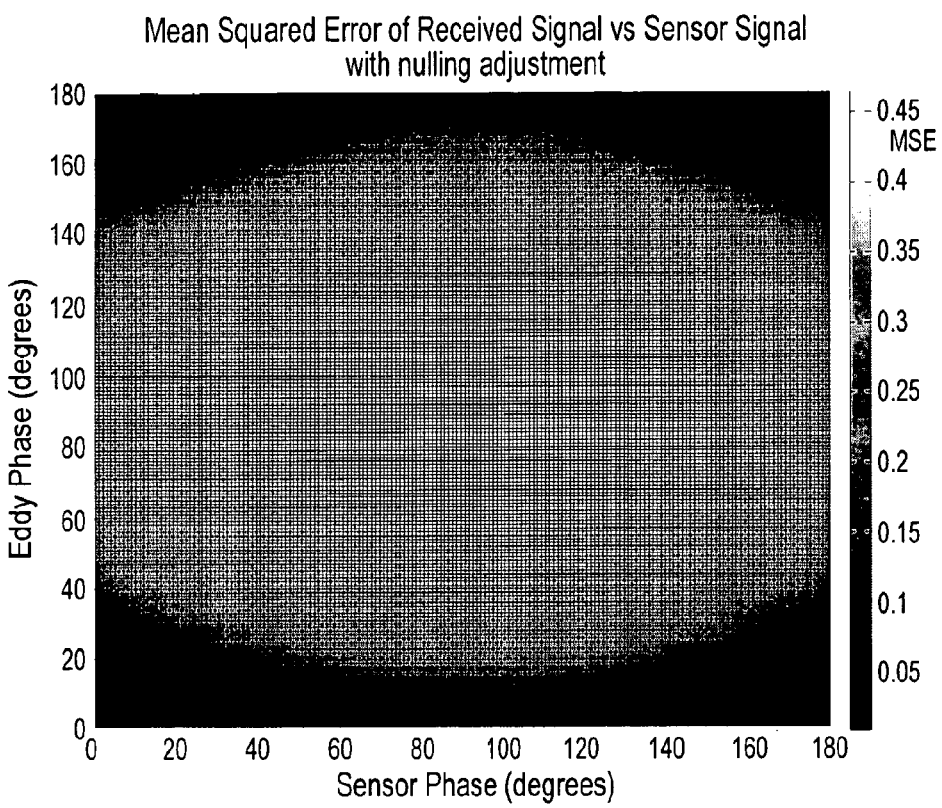
FIG. 6 is a plot of the Mean Squared Error between the magnetic field detected by the interrogator transducer through a conductive barrier and the actual magnetic field generated by the sensor transducer after one of the nulling techniques of the present invention has been applied to the interrogator transducer.
Figure 7:
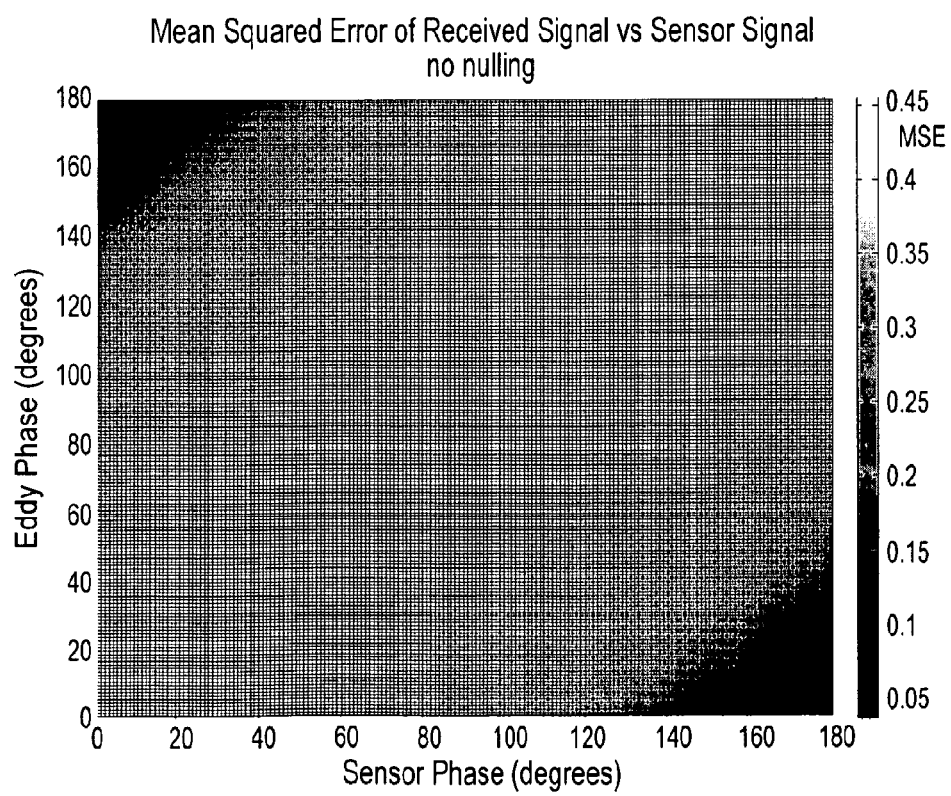
FIG. 7 is a plot similar to FIG. 6 but without the nulling technique applied to the interrogator transducer.

FIG. 6 is a plot of the Mean Squared Error (MSE) between the field detected by the receiver coil 26 and the actual sensor field as a function of the sensor and eddy current field phases with the above-described nulling technique being employed. The MSE shown is for an optimal receiver/transmitter interleave distance, which is different for each phase combination. As can be seen in FIG. 6, for eddy current field phases near 0° and near 180°, the MSE is quite low for any range of sensor field phase, as the magnitude of the transmitter field seen by the receiver coil 26 can be used to cancel out most or all of the eddy current field. In comparison, FIG. 7 shows the received field mean squared error without this nulling technique. As can be seen, even though a complete nulling for any arbitrary eddy current field phase (which depends on conductivity of the barrier 14) may not be achieved, the results are much improved with even this simplest of nulling techniques. For many highly conductive materials, the eddy current field will have a phase near 180°. Thus, this nulling technique is particularly well suited to nulling out the eddy currents from these materials.

Figure 8:
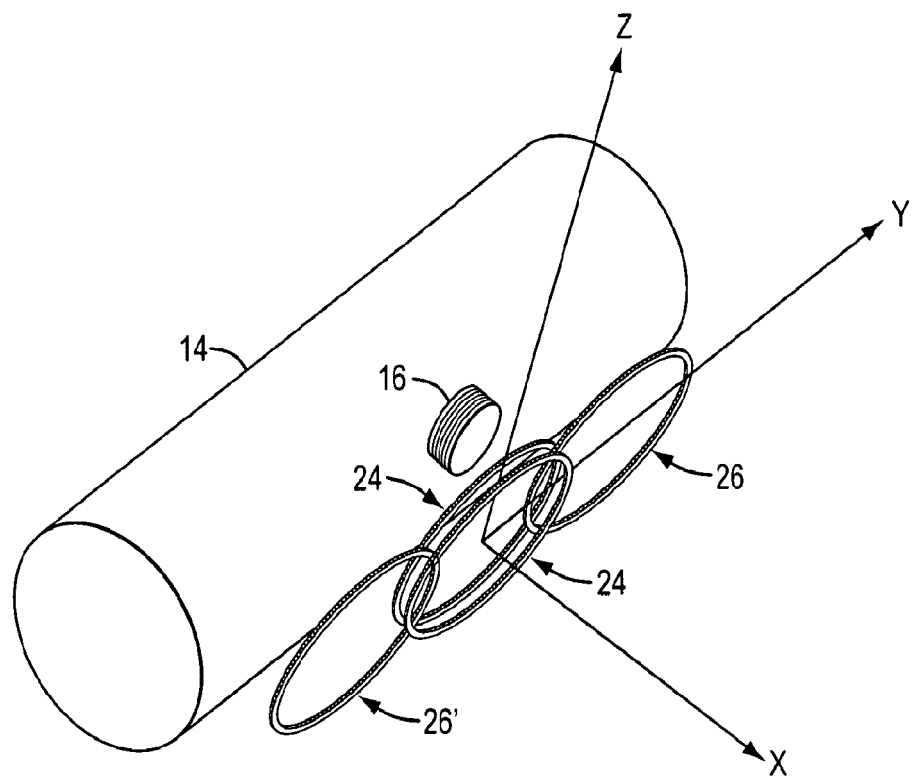
FIG. 8 is a perspective view of the interrogator transducer and sensor transducer components of another embodiment of the present invention.

In accordance with the present invention, other techniques may be used to null out the eddy current field. Referring to FIG. 8, for example, the sensor apparatus 10 may be provided with a second receiver coil 26' on the other side of the transmitter coils 24. In use, the interrogator transducer 12 is positioned so that the area of overlap between the transmitter coils 24 and the first receiver coil 26 is opposite the sensor transducer 16. Because the area of sensitivity to the sensor field is primarily in this area of overlap, the first receiver coil 26 will primarily detect both the sensor field and the eddy current field, while the second receiver coil 26' will primarily detect only the eddy current field. By subtracting these signals using, e.g., a differential amplifier, the remaining signal would represent the magnetic field generated by the sensor transducer 16 alone.

Figure 9:
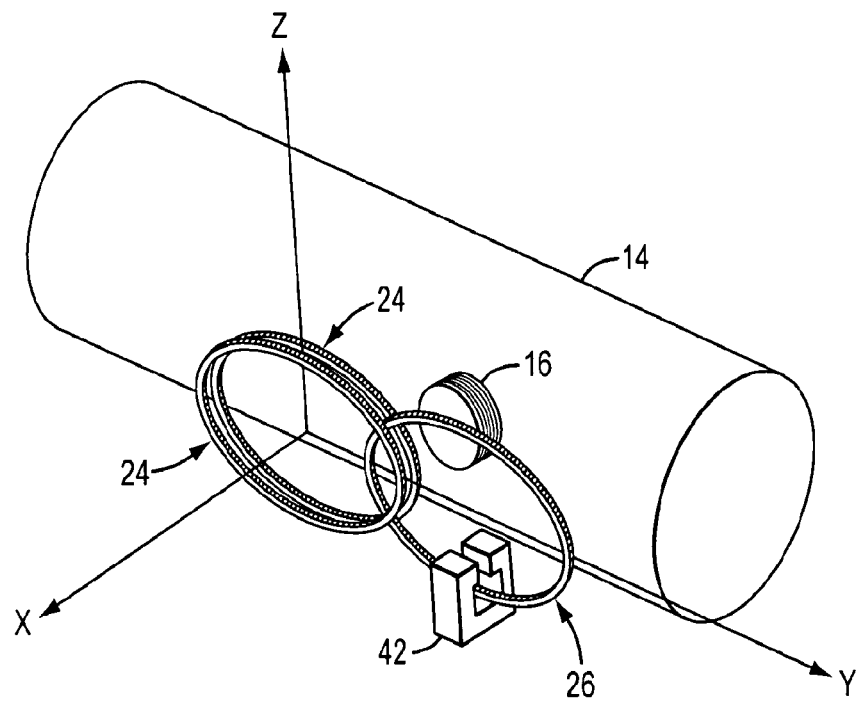
FIG. 9 is a perspective view of the interrogator transducer and sensor transducer components of still another embodiment of the present invention.

Another technique for nulling out the eddy current field is illustrated in FIG. 9. In this embodiment, the sensor apparatus 10 includes a nulling transducer 42 for generating a magnetic field which nulls out the eddy current field seen by the receiver coil 26. The nulling transducer 42 comprises coil which is wound on a toroidal or, as shown in FIG. 9, a generally C-shaped core that is positioned around a segment of the receiver coil 26. The coil is driven with a signal which is initially 180 degrees out of phase with the excitation signal used to drive the transmitter coils 24. During calibration of this apparatus, the signal phase and amplitude are adjusted until the eddy current field as seen by the receiver coil 26 is essentially zero. Thus, during operation of this embodiment of the sensor transducer, the only field detected by the receiver coil 26 will be the sensor field.

One advantage of the present invention is that, since the sensor transducer 16 is a non-powered device and the active electrical components of the sensor apparatus 10 (i.e., the interrogator transducer 12, the signal generator 18 and the signal processor 20) are located outside the barrier, the sensor apparatus is particularly suitable for use in high pressure, high temperature and explosive environments. In an embodiment of the invention which is suitable for measuring temperature under such conditions, the wire 34 ideally comprises high temperature varnished copper wire, the core 36 is preferably made of steel or another high permeability material with a high Curie temperature, and the sensor device 38 is a conventional high temperature thermistor.

It should be recognized that, while the present invention has been described in relation to the preferred embodiments thereof, those skilled in the art may develop a wide variation of structural and operational details without departing from the principles of the invention. Therefore, the appended claims are to be construed to cover all equivalents falling within the true scope and spirit of the invention.

What is claimed is:

1. A sensor apparatus which comprises:
   a first magnetic transducer which in use is positioned on a first side of a barrier, the first transducer being configured to generate a first purely magnetic field; and
   a second magnetic transducer which in use is positioned on a second side of the barrier opposite the first side, the second transducer comprising a magnetic or electrical property which is dependent upon a sensible condition on the second side of the barrier and a sensor coil which is configured to generate a second purely magnetic field;
   wherein in operation of the sensor apparatus the first transducer generates the first magnetic field, which induces the sensor coil to generate the second magnetic field, the second magnetic field being dependent upon the magnetic or electrical property of the second transducer; and
   wherein the first transducer detects the second magnetic field and in response thereto generates a signal which is representative of the sensible condition on the second side of the barrier.

2. The sensor apparatus of claim 1, wherein the first transducer comprises at least one transmitter coil for generating the first magnetic field and at least one receiver coil for detecting the second magnetic field.

3. The sensor apparatus of claim 2, wherein the first transducer comprises two transmitter coils for generating the first magnetic field.

4. The sensor apparatus of claim 3, wherein each of the transmitter coils and the receiver coils comprises a toroid.

5. The sensor apparatus of claim 3, wherein the transmitter coils are positioned coaxially and in parallel planes and the receiver coil is positioned parallel to the transmitter coils.

6. The sensor apparatus of claim 5, wherein the receiver coil is positioned between the transmitter coils a distance sufficient to substantially null out the first magnetic field at the receiver coil.

7. The sensor apparatus of claim 5, wherein the receiver coil is positioned between the transmitter coils a distance sufficient to at least partially null out at the receiver coil a reflected magnetic field generated by eddy currents in the barrier.

8. The sensor apparatus of claim 2, further comprising a nulling transducer for generating a third magnetic field which is sufficient to at least partially null out at the receiver coil a reflected magnetic field generated by eddy currents in the barrier.

9. The sensor apparatus of claim 8, wherein the nulling transducer comprises a coil which is wound around a generally C-shaped core.

10. The sensor apparatus of claim 9, wherein the C-shaped core is positioned around a segment of the receiver coil.

11. The sensor apparatus of claim 8, wherein the nulling transducer comprises a coil which is wound around a toroidal core.

12. The sensor apparatus of claim 11, wherein the toroidal core is positioned around a segment of the receiver coil.

13. The sensor apparatus of claim 2, wherein at least one of the transmitter coil and the receiver coil further comprises a disc-shaped core which is positioned concentrically therein and is made of a high permeability material.

14. The sensor apparatus of claim 1, wherein the first transducer comprises at least one transmitter coil for generating the first magnetic field, a first receiver coil for detecting both the second magnetic field and a reflected magnetic field generated by eddy currents in the barrier, and a second receiver coil for detecting primarily the reflected magnetic field.

15. The sensor apparatus of claim 14, wherein the first transducer comprises two transmitter coils for generating the first magnetic field.

16. The sensor apparatus of claim 15, wherein the transmitter coils are positioned coaxially and in parallel planes and the receiver coils are positioned parallel to the transmitter coils.

17. The sensor apparatus of claim 16, wherein the first receiver coil is positioned partially between the transmitter coils on one side of the transmitter coils and the second receiver coil is positioned partially between the transmitter coils on the diametrically opposite side of the transmitter coils.

18. The sensor apparatus of claim 17, wherein the sensor coil is positioned opposite the area of overlap between the transmitter coils and the first receiver coil.

19. The sensor apparatus of claim 14, wherein the first receiver coil generates a first signal, the second receiver coil generates a second signal and the sensor apparatus further comprises means for combining the first and second signals to produce the signal which is representative of the sensible condition on the second side of the barrier.

20. The sensor apparatus of claim 1, wherein the barrier comprises a conductive barrier and the first transducer is positioned against the conductive barrier.

21. The sensor apparatus of claim 1, wherein the barrier comprises a conductive barrier and the second transducer is positioned against the conductive barrier.

22. The sensor apparatus of claim 1, wherein the second transducer comprises a passive sensor device having an electrical property which is dependent upon the sensible condition on the second side of the barrier.

23. The sensor apparatus of claim 22, wherein the sensor coil comprises a coil of conductive wire which is coupled to the sensor device.

24. The sensor apparatus of claim 23, wherein the sensor device is electrically connected between the ends of the wire.

25. The sensor apparatus of claim 23, wherein the second transducer further comprises a magnetically permeable core around which the wire is wound.

26. The sensor apparatus of claim 25, wherein the core comprises a relative magnetic permeability of greater than about 1000.

27. The sensor apparatus of claim 1, wherein the sensor coil comprises a coil of conductive wire whose ends are connected together.

28. The sensor apparatus of claim 27, wherein the second transducer further comprises a magnetically permeable core around which the wire is wound.

29. A sensor apparatus which comprises:
  a first magnetic transducer which in use is positioned on a first side of a conductive barrier the first transducer being configured to generate a first magnetic field which is capable of passing through the barrier; and
  a second magnetic transducer which in use is positioned on a second side of the barrier opposite the first side, the second transducer comprising a magnetic or electrical property which is dependent upon a sensible condition on the second side of the barrier and being configured to generate a second magnetic field which is capable of passing through the barrier;
  wherein in operation of the sensor apparatus the first transducer generates the first magnetic field, which induces the second transducer to generate the second magnetic field, the second magnetic field being dependent upon the magnetic or electrical property of the second transducer; and
  wherein the first transducer detects the second magnetic field and in response thereto generates a signal which is representative of the sensible condition on the second side of the barrier.

30. The sensor apparatus of claim 29, wherein the first transducer comprises at least one transmitter coil for generating the first magnetic field and at least one receiver coil for detecting the second magnetic field.

31. The sensor apparatus of claim 30, wherein the first transducer comprises two transmitter coils for generating the first magnetic field.

32. The sensor apparatus of claim 31, wherein each of the transmitter coils and the receiver coils comprises a toroid.

33. The sensor apparatus of claim 31, wherein the transmitter coils are positioned coaxially and in parallel planes and the receiver coil is positioned parallel to the transmitter coils.

34. The sensor apparatus of claim 33, wherein the receiver coil is positioned between the transmitter coils a distance sufficient to substantially null out the first magnetic field at the receiver coil.

35. The sensor apparatus of claim 33, wherein the receiver coil is positioned between the transmitter coils a distance sufficient to substantially null out at the receiver coil a reflected magnetic field generated by eddy currents in the barrier.

36. The sensor apparatus of claim 30, further comprising a nulling transducer for generating a third magnetic field which is sufficient to at least partially null out at the receiver coil a reflected magnetic field generated by eddy currents in the barrier.

37. The sensor apparatus of claim 36, wherein the nulling transducer comprises a coil which is wound around a generally C-shaped core.

38. The sensor apparatus of claim 37, wherein the C-shaped core is positioned around a segment of the receiver coil.

39. The sensor apparatus of claim 36, wherein the nulling transducer comprises a coil which is wound around a toroidal core.

40. The sensor apparatus of claim 39, wherein the toroidal core is positioned around a segment of the receiver coil.

41. The sensor apparatus of claim 30, wherein at least one of the transmitter coil and the receiver coil further comprises a disc-shaped core which is positioned concentrically therein and is made of a high permeability material.

42. The sensor apparatus of claim 29, wherein the first transducer comprises at least one transmitter coil for generating the first magnetic field, a first receiver coil for detecting both the second magnetic field and a reflected magnetic field generated by eddy currents in the barrier, and a second receiver coil for detecting primarily the reflected magnetic field.

43. The sensor apparatus of claim 42, wherein the first transducer comprises two transmitter coils for generating the first magnetic field.

44. The sensor apparatus of claim 43, wherein the transmitter coils are positioned coaxially and in parallel planes and the receiver coils are positioned parallel to the transmitter coils.

45. The sensor apparatus of claim 44, wherein the first receiver coil is positioned partially between the transmitter coils on one side of the transmitter coils and the second receiver coil is positioned partially between the transmitter coils on the diametrically opposite side of the transmitter coils.

46. The sensor apparatus of claim 45, wherein the second transducer is positioned opposite the area of overlap between the transmitter coils and the first receiver coil.

47. The sensor apparatus of claim 42, wherein the first receiver coil generates a first signal, the second receiver coil generates a second signal and the sensor apparatus further comprises means for combining the first and second signals to produce the signal which is representative of the sensible condition on the second side of the barrier.

48. The sensor apparatus of claim 29, wherein the first transducer is positioned against the conductive barrier.

49. The sensor apparatus of claim 29, wherein the second transducer is positioned against the conductive barrier.

50. The sensor apparatus of claim 29, wherein the second transducer comprises a passive sensor device having an electrical property which is dependent upon the sensible condition on the second side of the barrier.

51. The sensor apparatus of claim 50, wherein the second transducer further comprises a coil of conductive wire which is coupled to the sensor device.

52. The sensor apparatus of claim 51, wherein the sensor device is electrically connected between the ends of the wire.

53. The sensor apparatus of claim 51, wherein the second transducer further comprises a magnetically permeable core around which the wire is wound.

54. The sensor apparatus of claim 53, wherein the core comprises a relative magnetic permeability of greater than about 1000.

55. The sensor apparatus of claim 29, wherein the second transducer comprises a coil of conductive wire whose ends are connected together.

56. The sensor apparatus of claim 55, wherein the second transducer further comprises a magnetically permeable core around which the wire is wound.

57. A sensor apparatus which comprises:
a first magnetic transducer which in use is positioned on a first side of a barrier, the first transducer con d to a first purely magnetic field; and
a second magnetic transducer which in use is positioned on a second side of the barrier opposite the first side, the second transducer comprising a magnetic or electrical property which is dependent upon a sensible condition on the second side of the barrier and a sensor coil which is configured to generate a second purely magnetic field;
wherein in operation of the sensor apparatus the first transducer continuously generates the first magnetic field, which induces the sensor coil to continuously generate the second magnetic field, the second magnetic field being dependent upon the magnetic or electrical property of the second transducer; and
wherein as the first transducer is transmitting the first magnetic field it detects the second magnetic field and in response thereto generates a signal which is representative of the sensible condition on the second side of the barrier.

58. The sensor apparatus of claim 57, wherein the first transducer comprises at least one transmitter coil for generating the first magnetic field and at least one receiver coil for detecting the second magnetic field.

59. The sensor apparatus of claim 58, wherein the first transducer comprises two transmitter coils for generating the first magnetic field.

60. The sensor apparatus of claim 59, wherein each of the transmitter coils and the receiver coils comprises a torpid.

61. The sensor apparatus of claim 59, wherein the transmitter coils are positioned coaxially and in parallel planes and the receiver coil is positioned parallel to the transmitter coils.

62. The sensor apparatus of claim 61, wherein the receiver coil is positioned between the transmitter coils a distance sufficient to substantially null out the first magnetic field at the receiver coil.

63. The sensor apparatus of claim 61, wherein the receiver coil is positioned between the transmitter coils a distance sufficient to substantially null out at the receiver coil a reflected magnetic field generated by eddy currents in the barrier.

64. The sensor apparatus of claim 58, further comprising a nulling transducer for generating a third magnetic field which is sufficient to at least partially null out at the receiver coil a reflected magnetic field generated by eddy currents in the barrier.

65. The sensor apparatus of claim 64, wherein the nulling transducer comprises a coil which is wound around a generally C-shaped core.

66. The sensor apparatus of claim 65, wherein the C-shaped core is positioned around a segment of the receiver coil.

67. The sensor apparatus of claim 64, wherein the nulling transducer comprises a coil which is wound around a toroidal core.

68. The sensor apparatus of claim 67, wherein the toroidal core is positioned around a segment of the receiver coil.

69. The sensor apparatus of claim 58, wherein at least one of the transmitter coil and the receiver coil further comprises a disc-shaped core which is positioned concentrically therein and is made of a high permeability material.

70. The sensor apparatus of claim 57, wherein the first transducer comprises at least one transmitter coil for generating the first magnetic field, a first receiver coil for detecting both the second magnetic field and a reflected magnetic field generated by eddy currents in the barrier, and a second receiver coil for detecting primarily the reflected magnetic field.

71. The sensor apparatus of claim 70, wherein the first transducer comprises two transmitter coils for generating the first magnetic field.

72. The sensor apparatus of claim 71, wherein the transmitter coils are positioned coaxially and in parallel planes and the receiver coils are positioned parallel to the transmitter coils.

73. The sensor apparatus of clam 72, wherein the first receiver coil is positioned partially between the transmitter coils on one side of the transmitter coils and the second receiver coil is positioned partially between the transmitter coils on the diametrically opposite side of the transmitter coils.

74. The sensor apparatus of claim 73, wherein the sensor coil is positioned opposite the area of overlap between the transmitter coils and the first receiver coil.

75. The sensor apparatus of claim 70, wherein the first receiver coil generates a first signal, the second receiver coil generates a second signal and the sensor apparatus further comprises means for combining the first and second signals to produce the signal which is representative of the sensible condition on the second side of the barrier.

76. The sensor apparatus of claim 57, wherein the barrier comprises a conductive barrier and the first transducer is positioned against the conductive barrier.

77. The sensor apparatus of claim 57, wherein the barrier comprises a conductive barrier and the second transducer is positioned against the conductive barrier.

78. The sensor apparatus of claim 57, wherein the second transducer comprises a passive sensor device having an electrical property which is dependent upon the sensible condition on the second side of the barrier.

79. The sensor apparatus of claim 78, wherein the sensor coil comprises a coil of conductive wire which is coupled to the sensor device.

80. The sensor apparatus of claim 79, wherein the sensor device is electrically connected between the ends of the wire.

81. The sensor apparatus of claim 79, wherein the second transducer further comprises a magnetically permeable core around which the wire is wound.

82. The sensor apparatus of claim 81, wherein the core comprises a relative magnetic permeability of greater than about 1000.

83. The sensor apparatus of claim 57, wherein the sensor coil comprises a coil of conductive wire whose ends are connected together.

84. The sensor apparatus of claim 83, wherein the second transducer further comprises a magnetically permeable core around which the wire is wound.

85. A method for detecting a sensible condition on a first side of a barrier from a second side of the barrier opposite the first side, the method comprising:
    positioning a magnetic transducer on the first side of the barrier, the transducer comprising a magnetic or electrical property which is dependent upon a sensible condition on the first side of the barrier and a sensor coil which is configured to generate a purely magnetic field;
    generating a first purely magnetic field on the second side of the barrier to induce the sensor coil to generate a second purely magnetic field which is dependent upon the magnetic or electrical property of the transducer;
    detecting the second magnetic field on the second side of the barrier: and
    generating a signal in response to the second magnetic field which is representative of the sensible condition on the second side of the barrier.

86. The method of claim 85, wherein the barrier comprises a conductive barrier.

87. The method of claim 86, further comprising nulling out on the second side of the barrier a reflected magnetic field generated by eddy currents in the harder.

88. The method of claim 85, wherein the steps of generating the first magnetic field and detecting the second magnetic field are performed simultaneously.

* * * * *